United States Patent [19]

Iizuka

[11] Patent Number: 4,631,563
[45] Date of Patent: Dec. 23, 1986

[54] METAL OXIDE SEMICONDUCTOR FIELD-EFFECT TRANSISTOR WITH METAL SOURCE REGION

[75] Inventor: Tetsuya Iizuka, Kawasaki, Japan

[73] Assignee: Tokyo Shibaura Denki Kabushiki Kaisha, Kawasaki, Japan

[21] Appl. No.: 585,639

[22] Filed: Mar. 8, 1984

Related U.S. Application Data

[63] Continuation of Ser. No. 211,929, Dec. 1, 1980, abandoned.

[30] Foreign Application Priority Data

Dec. 7, 1979 [JP] Japan .................. 54-157967

[51] Int. Cl.$^4$ ............................................ H01L 29/78
[52] U.S. Cl. .................... 357/23.1; 357/23.7; 357/41; 357/65; 357/86
[58] Field of Search ........................ 357/23, 41, 51, 65, 357/86

[56] References Cited

U.S. PATENT DOCUMENTS

| | | | |
|---|---|---|---|
| 3,097,308 | 7/1963 | Wallmark | 357/23 |
| 3,206,670 | 9/1965 | Atalla | 357/23 |
| 3,390,352 | 6/1968 | Kleinknecht | 357/23 |
| 3,444,442 | 5/1969 | Yanagawa | 357/23 |
| 3,454,795 | 7/1969 | Hatcher | 357/23 |
| 3,500,138 | 3/1970 | Richman | 357/23 |
| 3,544,864 | 12/1970 | Richman | 357/23 |
| 3,553,498 | 1/1971 | Yamada | 357/23 |
| 3,569,799 | 3/1971 | Fang et al. | 357/23 |
| 3,639,813 | 2/1972 | Kamoshida et al. | 357/23 |
| 3,753,055 | 8/1973 | Yamashita et al. | 357/23 |
| 4,054,895 | 10/1977 | Ham | 357/23 TF |
| 4,131,909 | 12/1978 | Matsuda et al. | 357/41 |
| 4,132,903 | 1/1979 | Graham | 357/23 |
| 4,139,786 | 2/1979 | Raymond et al. | 357/41 |
| 4,271,424 | 6/1981 | Inayoshi et al. | 357/86 |

OTHER PUBLICATIONS

A. Fowler, "Thin–Film Trans. Using Therm. Grown SiO$_2$", IBM Tech. Discl. Bull., vol. 10, #8, Jan. 1968, p. 1087.
A. Fowler et al., "Inverted Thin-Film Transistor", IBM Tech. Discl. Bull., vol. 11, #9, Feb. 1969, p. 1137.
A. Fowler, "Ion-Implanted Inverted FET", IBM Tech. Discl. Bull., vol. 12, #12, 1970, p. 2089.
K. Kroell, "Integrated CMOS Structure", IBM Tech. Discl. Bull., vol. 15, #9, Feb. 1973, pp. 2856, 2857.

*Primary Examiner*—Joseph E. Clawson, Jr.
*Attorney, Agent, or Firm*—Finnegan, Henderson, Farabow, Garrett & Dunner

[57] ABSTRACT

A source region and a drain region are formed in a semiconductor layer, a thin insulating layer of SiO$_2$ is formed on the semiconductor layer, and a gate electrode is formed thereover. Al metal forms ohmic contacts with the source and drain regions to provide a source electrode and a drain electrode, respectively. Al diffused in the drain region remains within the drain region, and the drain region and the substrate region form a p-n junction. Al diffused in the source region traverses the source region and reaches the substrate region to form an ohmic contact between the source region and the substrate region.

3 Claims, 11 Drawing Figures

METAL OXIDE SEMICONDUCTOR FIELD-EFFECT TRANSISTOR WITH METAL SOURCE REGION

This application is a continuation of application Ser. No. 211,929, filed Dec. 1, 1980, now abandoned.

BACKGROUND OF THE INVENTION

The present invention relates to a metal oxide semiconductor field-effect transistor (to be referred to as a MOSFET for brevity hereinafter) which is improved in operation speed and packing density.

A MOSFET is known in which a semiconductor region is formed on an insulating substrate, an n- or p-type impurity is diffused to a high concentration in the semiconductor region to form a source region and a drain region, and a thin insulation film is covered thereover to form a gate electrode. Although such a transistor is applicable to various purposes, it is frequently used as an integrated circuit. The performance which is generally required of such an integrated circuit includes high operation speed, high packing density and so on.

In a conventional MOSFET 20 as shown in FIG. 1, on an insulating substrate 22 of monocrystalline sapphire is formed a substrate 24 of Si in which is diffused a p-type impurity, for example B, to a concentration of $10^{15}$ atoms/cm$^3$. A source region 26 and a drain region 28, in both of which is diffused an n-type impurity, for example P, to a concentration of $10^{18}$ atoms/cm$^3$, are formed in the Si substrate. Metal wirings of, for example Al, are coupled to the source region 26 and the drain region 28 providing a source electrode 34 and a drain electrode 36. The metal constituting these electrodes forms ohmic contacts with the source region 26 and the drain region 28, but part of the aluminum is diffused in the source and drain regions to form diffusion layers 30 and 32. A gate electrode 40 is formed on the substrate region 25 through a thin insulating layer 38 consisting of SiO$_2$, for example.

With such a conventional structure, high speed operation of the circuit is obstructed by the so-called charge pumping effect. Since the substrate region 25 is electrically coupled to the source region 26 and the drain region 28 only through the p-n junction, the substrate region 25 is kept at a negative potential by capacitive coupling with the gate electrode when the potential at the gate electrode abruptly changes in the negative potential. Then, the substrate region 25 and the source region 26, and the substrate 25 and the drain region 28 are kept reversely biased. When the potential of the gate electorde 40 changes in the positive direction, the potential of the substrate region 25 also changes in the positive direction. However, the p-n junction between the substrate region 25 and the source region 26 and that between the substrate region 25 and the drain region 28 are forwardly biased so that forward current flows and the potential at the substrate region 25 does not greatly shift in the positive direction. Thus, the substrate region 25 is kept at a negative potential on the average, and raises the threshold voltage of the MOSFET by the substrate bias effect or the body effect. When the threshold voltage becomes higher, the conductance of the MOSFET becomes small so that high speed operation of the circuit is obstructed. Especially with a MOSFET in which the substrate bias is not constant, i.e., a MOSFET of an SOS (silicon on sapphire) structure, the operation speed is disadvantageously easy to change due to fluctuations of the substrate bias. When the MOSFET is used as a transfer gate, it is frequently the case that a negative voltage compared with that of the source and drain regions is applied to the gate electrode under the condition that an inversion layer is not formed. Accordingly, the capacitive coupling between the gate electrode and the substrate region tends to be strong. Thus, as has been described, the threshold voltage increases by the substrate bias effect so that high speed operation of the element tends to be obstructed. Of course, when an inversion layer is formed, screening effects are obtained between the gate electrode and the substrate region so that the capacitive coupling between the gate electrode and the substrate region becomes weak, thereby reducing the above-described defects.

SUMMARY OF THE INVENTION

It is, therefore, the primary object of the present invention to provide a MOSFET which, prevents the charge pumping effect of the gate and enables high speed operation of the circuit, and has a high packing density.

In order to accomplish the above and other objects, the present invention provides a MOSFET in which an ohmic contact is formed between the source region and the substrate region.

With such a construction, it becomes possible to prevent the threshold voltage of the MOSFET from increasing due to the practical drop of the substrate biasing voltage of the substrate region, and to enable high speed operation.

In a MOSFET of SOS structure such a construction is especially effective in preventing changes in the operation speed due to fluctuations of the substrate biasing voltage.

When the MOSFET is used as a transfer gate, a strong capacitive coupling tends to be generated between the gate electrode and the substrate region so that the high speed operation of the element tends to be obstructed. This may be prevented by the construction described above.

As an additional effect, by using a semiconductor substrate as a substrate, power may be supplied to the source region through the substrate region so that the extra electrode becomes unnecessary and the packing density may be improved.

The other objects, features and advantages of the present invention will become more apparent from the following description with reference to the accompanying drawings.

DETAILED DESCRIPTION OF THE PREFERRED EMBODIMENTS

Figure 1:
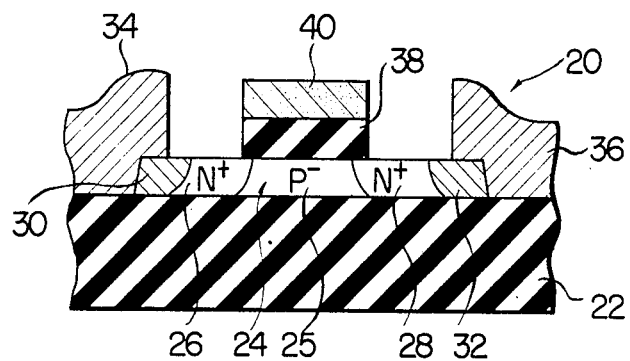
FIG. 1 is a sectional view of a conventional MOSFET formed on an insulating substrate.

The prior art example has already been described in the "Background of the Invention" referring to FIG. 1. The present invention for eliminating the defects of the prior art will now be described with reference to its embodiments.

Figure 2:
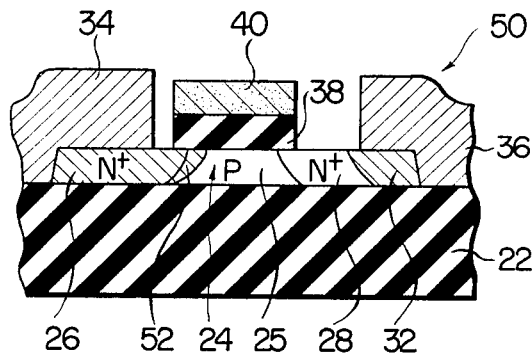
FIG. 2 is a sectional view of an embodiment of a MOSFET according to the present invention which is formed on an insulating substrate and in which the metal of an electrode diffuses through the source region to the substrate region and which is formed on an insulating substrate.

FIG. 2 shows a MOSFET 50 of the present invention which is formed on an insulating layer 22 which is a monocrystalline sapphire substrate. An Si substrate 24 in which is diffused a p-type impurity, for example B, to a concentration of $10^{15}$ atoms/cm$^3$, is arranged on the insulating substrate 22. A source region 26 and a drain region 28 in which is diffused an n-type impurity, for example P, to a concentration of $10^{18}$ atoms/cm$^3$, are also formed in the Si substrate. Metal wirings of Al, for example, are coupled to the source region 26 and the drain region 28 to provide a source electrode 34 and a drain electrode 36. Aluminum is diffused in the source region 26 and the drain region 28 and forms respective diffusion layers 52 and 32. The source electrode 34 and the source region 26 form an ohmic contact, and the drain electrode 36 and the drain region 28 form another. However, aluminum diffused in the source region 26 further reaches the substrate region 25 and forms an ohmic contact with the substrate region. Al diffused in the drain region 28 remains within this region and does not reach the substrate region 25. An insulating layer 38 made of, for example, SiO$_2$ with a thickness of 300 to 1500 Å is formed on the substrate region 25. A gate electrode 40 of, for example Al or polycrystalline silicon, for example, is formed on the insulating layer 38.

With this construction, the source region 26 and the substrate region 25 form an ohmic contact. When the potential of the gate electrode 40 changes in the negative direction, the potential of the substrate region 25 also changes in the negative direction. However, since the substrate region 25 and the source region 26 form an ohmic contact, a considerably high leakage current flows even when the substrate region 25 and the source region 26 are reversely biased, so that the potential of the substrate region does not change much in the negative direction. When a positive potential is applied to the gate electrode 40, the potential of the substrate region 25 also changes in the positive direction. However, the p-n junction between the substrate region 25 and the source region 26 and that between the substrate region 25 and the drain region 28 are forwardly biased so that forward current flows and the potential of the substrate region 25 does not increase. Accordingly, although the substrate region 25 is kept at a negative potential on the average, it is not as great a negative value as in the conventional cases so that the increase in the threshold voltage due to the substrate bias effect may be suppressed to a low value. Although the operation time of the conventional MOSFET is about 28 ns, it has been confirmed that the operation time of the MOSFET with the above construction according to the present invention may be shortened to 18 ns, and the high speed operation of the circuit is significantly improved.

The diffusion layer 52 of Al may be formed in any shape. In a MOSFET wherein a diffusion layer 26 is formed, as in FIG. 2, the diffusion layer 52 may or may not be coupled with the inversion layer formed in the substrate region 25 below the gate electrode 40. It suffices that the diffusion layer 52 is diffused in the substrate region 25 to couple with the substrate region 25 for forming an ohmic contact.

However, the drain region 28 and the substrate region 25 must form a rectifying p-n junction for sustaining the nonconductive characteristics of the transistor (for making the current small when turning off the device).

Al metal for constructing the diffusion layer for forming an ohmic contact with the substrate region may be replaced by other metal such as Sb, In and so on.

Figure 3:
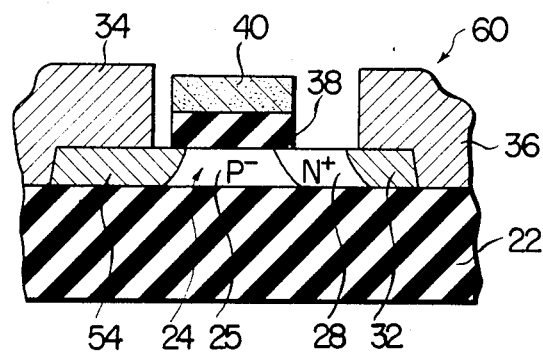
FIG. 3 is a sectional view of another embodiment of the MOSFET according to the present invention which is formed on an insulating substrate and in which the source region is formed by the metal diffusion layer of the metal of the source electrode and which is formed on an insulating substrate.

FIG. 3 shows another embodiment of the present invention. An n-type channel MOSFET 60 of this embodiment and the MOSFET 50 of the embodiment shown in FIG. 2 are different in that the source region 54 of the MOSFET 60 comprises the diffusion layer of an Al electrode. That is, an n-type impurity is not diffused in the source region 54. With this construction, the substrate region 25 and the source region 54 form an ohmic contact so that the increase in the threshold voltage due to the substrate bias effect is suppressed as has been described, and the high speed operation of the MOSFET is enabled.

The diffusion layer 54 of Al of this construction, unlike in the embodiment shown in FIG. 2, must be coupled to an inversion layer formed in the substrate region 25 below the gate electrode. This is because carriers may then be supplied from the source terminal to a channel region formed on the surface of the substrate region 25 of the n-type channel MOSFET of this figure.

Figure 4:
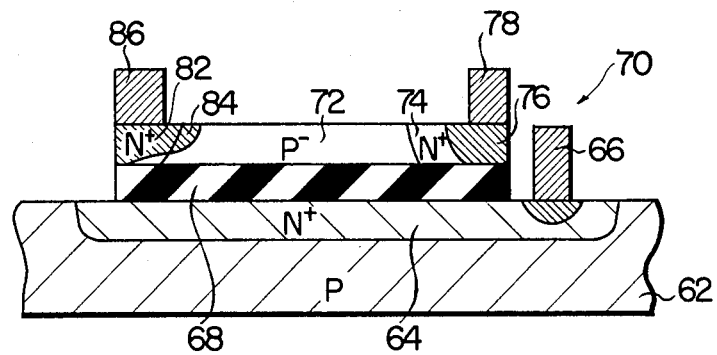
FIG. 4 is a sectional view of a MOSFET according to a modification of the present invention in which the semiconductor substrate is used as a gate electrode.

FIG. 4 shows an n-type channel MOSFET 70 using a semiconductor material as a substrate. A semiconductor layer 64 containing an n-type impurity diffused therein is formed in a silicon substrate 62 in which is diffused a p-type impurity. The semiconductor layer 64 forms an ohmic contact with an electrode 66 of Al to form a gate electrode. A thin insulating layer 68 of SiO$_2$, for example, is formed on this semiconductor layer; a polycrystalline silicon layer 72 in which is diffused a p-type impurity is formed thereover. An n-type impurity, for example P, is diffused at both ends of the polycrystalline silicon layer 72 to form a source region 82 and a drain region 74. Aluminum electrodes 86 and 78 form ohmic contacts with the source region 82 and the drain region 74, respectively, to form diffusion layers 84 and 76. The diffusion layer diffused in the drain region 74 remains inside the drain region 74, whereas the Al diffusion layer 84 diffused in the source region 82 extends through the source region 82 and reaches the substrate region 72. The diffusion layer 84 forms an ohmic contact with the substrate region 72.

Figure 5:
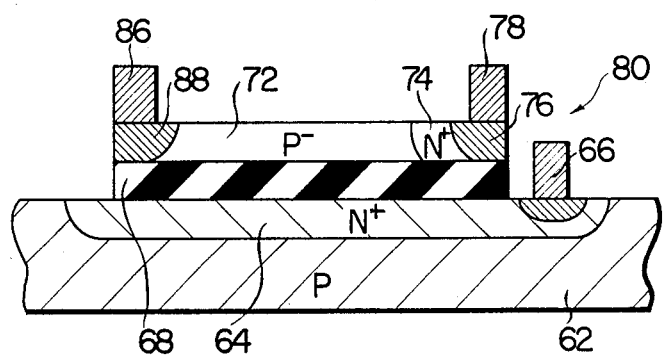
FIG. 5 is a sectional view of another modification of the MOSFET according to the present invention.

FIG. 5 shows an n-type channel MOSFET 80 as a modification of the embodiment shown in FIG. 4. As mentioned above, the p-type silicon semiconductor substrate 62 is used as the substrate. The n-type semiconductor layer 64 is formed in the semiconductor layer 62 for operating as a gate. The thin insulating layer 68 of SiO₂ is formed on the semiconductor layer 64, and the polycrystalline silicon layer 72 in which is diffused a p-type impurity is formed thereover. Unlike the above embodiment, an n-type impurity is diffused at only one end of the polycrystalline silicon layer 72 to form the drain region 74. A diffusion layer of an n-type impurity is not formed at the other end, but simply Al metal is ohmically coupled to form a source electrode 86 and a diffusion or source region 88. Although the substrate region 72 and the source region 88 form an ohmic contact, the diffusion layer 76 formed in the drain region 74 remains inside the drain region 74. However, the drain region 74 and the substrate region 72 form a rectifying p-n junction. With the construction shown in FIG. 5, the inversion layer inside the substrate region such that it lies below the gate layer 64 is necessarily coupled with the source region 88 so that the diffusion region 88 may be formed in any shape.

With the constructions shown in FIGS. 4 and 5, the operation time of the MOSFET is shortened and high speed operation of the circuit becomes possible. Since a semiconductor substrate is used as the gate, the insulating substrate 22 shown in FIG. 1 can be eliminated. Further, since the diffusion layer as the gate electrode also functions as a wiring layer, the packing density of the circuit may be improved.

Although the above description has been made with reference to an n-type channel MOSFET, it is to be understood that the present invention is similarly applicable to a p-type channel MOSFET.

Figure 6:
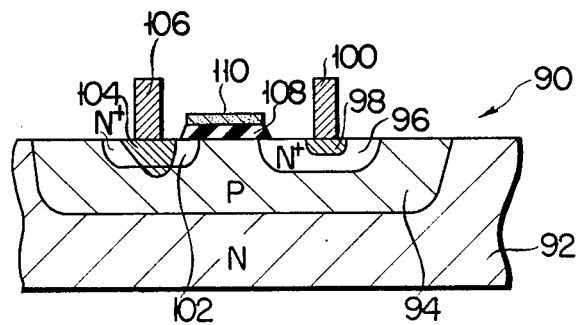
FIG. 6 is a sectional view of an embodiment of an n-type channel FET according to the present invention.

FIG. 6 shows another embodiment of the present invention as applied to an n-type channel FET 90. A p-type well region 94, in which is diffused a p-type impurity, is formed in a semiconductor substrate 92 in which is diffused an n-type impurity. A source region 102 and a drain region 96, in both of which is diffused an n-type impurity, are formed at two different places in the p-type well region 94. A drain electrode 100 of Al, for example, is ohmically coupled to the drain region 96, and an Al diffusion layer 98 is formed inside the drain region 96. The diffusion layer 98 does not extends outside the drain region 96. A source electrode 106 of Al forms an ohmic contact with the source region 102, and a diffusion layer 104 of Al is formed in the source region 102. The diffusion layer 104 extends through the source region 102 to reach the p-type well region 94. The p-type well region 94 and the diffusion layer 104 form an ohmic contact. The diffusion layer 104 may take any shape, as long as it reaches the p-type well region and forms an ohmic contact with the region.

A thin insulating layer 108 of SiO₂ is formed on the surface of the p-type well region between the source region 102 and the drain region 96. A gate electrode 110 of Al or polycrystalline silicon is formed on the insulating layer 108.

Figure 7:
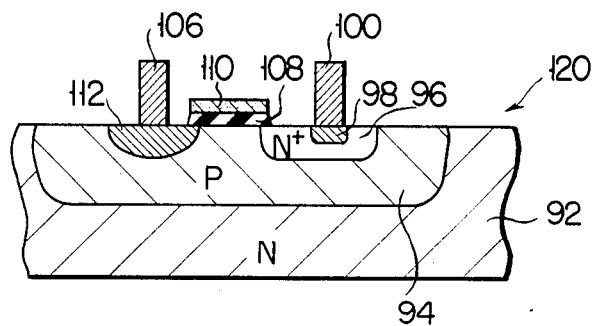
FIG. 7 is a sectional view of another embodiment of the n-type channel FET according to the present invention.

FIG. 7 shows another embodiment of the present invention as applied to an n-type channel FET 120. A source region 112 comprises only a diffusion layer of Al. This diffusion layer 112 is formed to be coupled with the inversion layer formed on the surface of the p-type well region 94 such that it lies below the gate electrode 110. Diffusion layer 112 forms an ohmic contact with the p-type well region.

Figure 8:
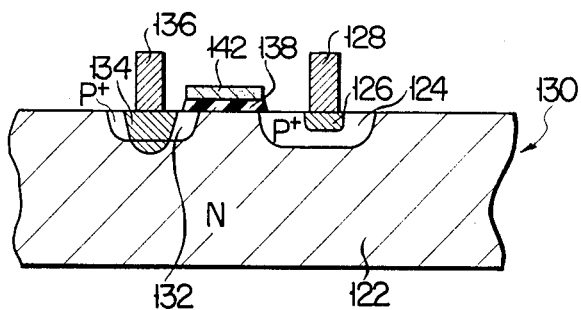
FIG. 8 is a sectional view of an embodiment of a p-type channel FET of the present invention.

FIG. 8 shows another embodiment of the present invention as applied to a p-type channel FET 130. A source region 132 and a drain region 124, both of which contain a diffused p-type impurity, are formed at different two places of a semiconductor substrate 122 in which is diffused an n-type impurity. A drain electrode 128 of Al, for example, forms an ohmic contact with the drain region 124, and a diffusion layer 126 of Al is formed inside the drain region 124. The impurity in the diffusion layer 126 does not diffuse outside the drain region 124.

An Al source electrode 136 forms an ohmic contact with the source region 132, and an Al diffusion layer 134 is formed in the source region 132. The diffusion layer 134 extends through the source region 132 and reaches the semiconductor substrate 122. The semiconductor substrate 122 and the diffusion layer 134 form an ohmic contact. The diffusion layer 134 may take any shape, as long as it diffuses to the semiconductor substrate 122 and forms an ohmic contact with the semiconductor substrate.

Figure 9:
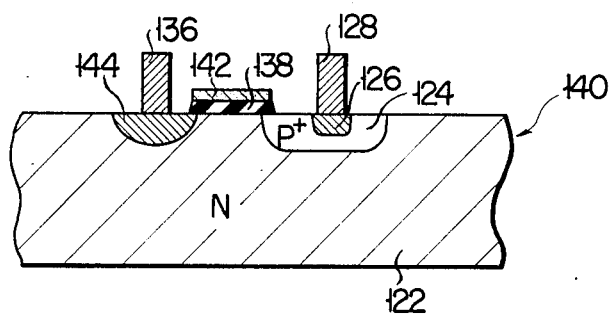
FIG. 9 is a sectional view of another embodiment of the p-type channel FET of the present invention.

FIG. 9 shows another embodiment of the present invention as applied to a p-type channel FET 140. As in the above embodiment, a source region 144 comprises only an Al diffusion layer. The diffusion layer 144 also forms an ohmic contact with the inversion layer formed in the semiconductor substrate 122 such that it lies below a gate electrode 142.

With the CMOSFETs shown in FIGS. 6, 7, 8 and 9, the source regions form ohmic contacts with the substrate regions. Impurity diffusion layers of the same shapes as those of the substrate or the p-type well region are conventionally formed for obtaining the potential of the substrate or the p-type well region. However, this is not necessary with these embodiments, so that a high packing density may be obtained. Since it is possible to supply power to the source region through the semiconductor substrate, the source electrodes 106 and 136 may be omitted. Thus, it becomes possible to improve the packing density of the circuit.

Although the metal for forming the diffusion layers for forming ohmic contacts with the substrate region has been described with reference to Al alone, it is to be understood that the present invention is not particularly limited to this, and metals such as Sb and In may be used.

Figure 10:
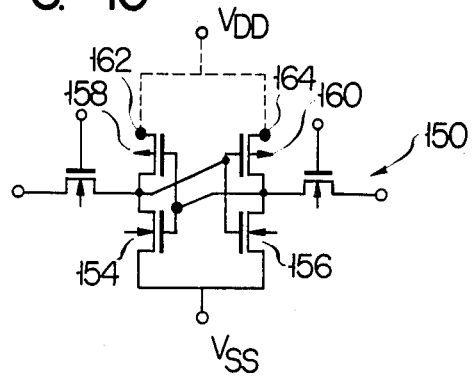
FIG. 10 is a circuit diagram illustrating the CMOS p-type channel FET of the present invention as applied to a memory cell.
Figure 11:
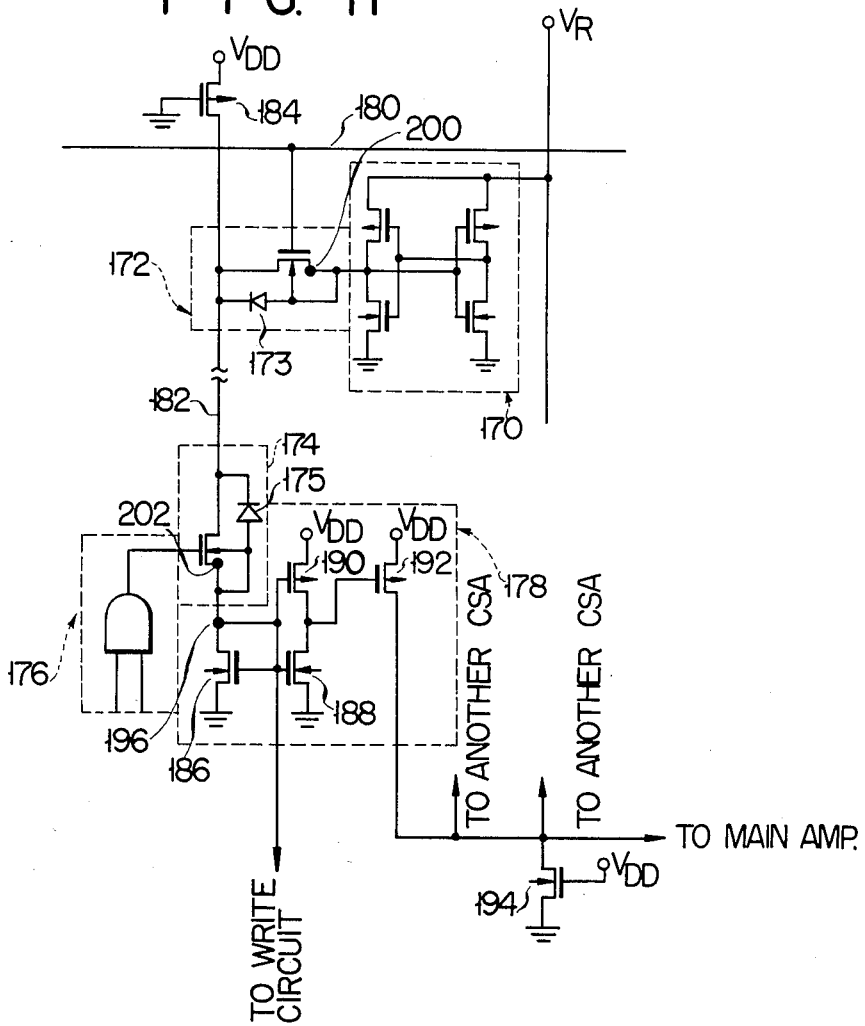
FIG. 11 is a circuit diagram illustrating the MOSFET of the present invention as applied to a memory device.

FIG. 10 shows the p-type channel FET of the present invention as applied to a CMOS memory cell 150. n-type channel FETs 154 and 156 and p-type channel FETs 158 and 160 form a flip-flop circuit. The source regions of the p-type channel FETs 158 and 160 form ohmic contacts 162 and 164 with the n-type substrate region. With such a construction, the power may be supplied to the source region through the semiconductor substrate so that the conventionally required power source wiring, shown by the broken line, may be omitted by the use of this p-type channel FET. Thus, a high packing density may be attained.

The present invention will now be described with reference to the MOSFET as applied to a transfer gate of a semiconductor memory device having an SOS structure. A memory storage 170 of the memory cell comprises a flip-flop of the CMOSFET. A column sense-amplifier (CSA) comprises n-type channel FETs 186 and 188 and p-type channel FETs 190 and 192. The potential of a node 196 is kept so as to be always (except when writing "1") lower than the potential of a bit line 182 by the n-type channel FET 186. With this construction, a parasitic diode 175 of a transfer gate 174 will not be forwardly biased. The potential of the bit line 182 is kept so as not to be lower than VDD−VF (VF is a forward biasing voltage for flowing current through a parasitic diode 173 of a transfer gate 172), except when writing "0", by a p-type channel FET 184.

The source region, which is always at a lower potential than the drain region, of the transfer gate 172 controlled by a word line 180 and the transfer gate 174 controlled by the output of a row decoder 176 forms ohmic contacts 200 and 202 with the substrate region. Thus, delays in the operation of the circuit due to fluctuations in the threshold voltage of the transfer gate may be prevented. When the MOSFET of SOS structure is used as the transfer gate, increases of the threshold voltage due to the substrate bias effect may be prevented to a remarkable degree with this construction.

In the memory device of this embodiment, the memory cell comprises five transistors of the memory storage 170 and the transfer gate 172. The writing operation and the reading operation must be separated with this construction. Conventionally, this separation has been attained by raising the word line 180 to a potential higher than VDD, the power source voltage. However, with this embodiment, the contents of the memory cell may be rewritten by lowering the power source voltage VR of the memory cell below the power source voltage VDD. The non-destructive read-out of the contents of the memory may be attained by making VR and VDD equal to each other and by making the potential of the word line not higher than VDD.

What is claimed is:

1. A metal oxide semiconductor field-effect transistor comprising:
    A semiconductor layer of a first conductivity type;
    means for providing an inversion layer carrier source consisting essentially of a metal diffusion region, formed in said semiconductor layer in ohmic contact with said semiconductor layer;
    a drain region of a second conductivity type formed in said semiconductor layer and separated from said metal diffusion region;
    an insulating layer formed on said semiconductor layer between said metal diffusion region and drain region;
    a gate layer formed on said insulating layer, whereby (i) current flows in a first direction between said metal diffusion region and said drain through an inversion layer which is induced in the surface of said semiconductor layer under said gate layer and which is coupled to said metal diffusion region when a first polarity voltage is applied to said gate layer, and (ii) a current flows in a second, opposite direciton between said metal diffusion region and said semicondcutor layer and a p-n junction between said semiconductor layer and said drain region is reverse biased when a second polarity votlage is applied to said gate layer.

2. A metal oxide semiconductor field-effect transistor according to claim 1, wherein said semiconductor layer is a semiconductor island formed on an insulating substrate.

3. A metal oxide semiconductor field-effect transistor according to claim 1, wherein said gate layer comprises a diffusion layer formed in a semiconductor substrate, and said semiconductor layer is a semiconductor island formed on said diffusion layer with said gate layer interposed therebetween.

* * * * *